United States Patent
Wu

(10) Patent No.: US 9,091,929 B2
(45) Date of Patent: *Jul. 28, 2015

(54) METHOD OF FORMING TIGHT-PITCHED PATTERN

(71) Applicant: NANYA TECHNOLOGY CORP., Tao-Yuan Hsien (TW)

(72) Inventor: Chun-Wei Wu, New Taipei (TW)

(73) Assignee: NANYA TECHNOLOGY CORP., Gueishan Dist., Taoyuan (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/249,371

(22) Filed: Apr. 10, 2014

(65) Prior Publication Data

US 2014/0205955 A1    Jul. 24, 2014

Related U.S. Application Data

(63) Continuation of application No. 13/591,243, filed on Aug. 22, 2012, now Pat. No. 8,815,498.

(51) Int. Cl.
   *G03F 7/20* (2006.01)
   *G03F 1/50* (2012.01)

(52) U.S. Cl.
   CPC .............. *G03F 7/2022* (2013.01); *G03F 7/203* (2013.01); *G03F 7/70458* (2013.01); *G03F 7/70466* (2013.01); *G03F 1/50* (2013.01)

(58) Field of Classification Search
   CPC ........................... G03F 7/2022; G03F 7/70466
   See application file for complete search history.

(56) References Cited

U.S. PATENT DOCUMENTS 6,528,238 B1    3/2003  Seniuk
2007/0275311 A1  11/2007  Wang

*Primary Examiner* — Kathleen Duda
(74) *Attorney, Agent, or Firm* — Winston Hsu; Scott Margo

(57) ABSTRACT

A method of forming a tight-pitched pattern. A target pattern including a plurality of first stripe patterns is provided. Each of the first stripe patterns has a first width and a first length. A photomask includes a plurality of second stripe patterns corresponding to the first stripe patterns is provided. Each of the second stripe patterns has a second width and a second length. A first exposure process with the photomask is provided in an exposure system. The first exposure process uses a first light source with a higher resolution that is capable of resolving the second width of each of the second stripe patterns. Finally, a second exposure process with the photo-mask is provided in the exposure system. The second exposure process uses a second light source with a lower resolution that is not adequate to resolve the second width of each of the second stripe patterns.

14 Claims, 11 Drawing Sheets

With:
CD=38.0nm
Contrast=0.697

Length:
CD=201.4nm
Contrast=0.685

With:
CD=38.0nm
Contrast=0.430

Length:
CD=182.8nm
Contrast=0.438

METHOD OF FORMING TIGHT-PITCHED PATTERN

CROSS REFERENCE TO RELATED APPLICATIONS

This is a continuation of U.S. application Ser. No. 13/591,243 filed Aug. 22, 2012, which is included in its entirety herein by reference.

BACKGROUND OF THE INVENTION

1. Field of the Invention

The present invention relates to a method of forming a pattern of a plurality of densely arranged stripes, and more particularly, to a method of forming a chain of tight-pitched contact patterns (contact chain) by using two exposures processes and one single mask.

2. Description of the Prior Art

In semiconductor manufacturing processes, in order to transfer an integrated circuit layout onto a semiconductor wafer, the integrated circuit layout is first designed and formed as a photo-mask pattern. The photomask pattern is then proportionally transferred to a photoresist layer positioned on the semiconductor wafer. However, with the increasing miniaturization of semiconductor devices, the line widths and lengths become finer and the image quality of the transferred pattern decreases.

Please refer to FIG. 1 and FIG. 2. FIG. 1 is a schematic diagram of a prior art photomask pattern. FIG. 2 is a schematic diagram of the simulation result of relative intensity of light in an exposure process with the photomask of FIG. 1. As shown in FIG. 1, a target pattern 100 includes a plurality of stripe patterns 102. Each stripe pattern 102 has a length of about 160 nm, a width of about 38 nm, and a pitch of about 76 nm. In order to form the target pattern such as pattern 100, a dipole illumination light is usually utilized as the light source during the exposure process. As shown in FIG. 2, by using the dipole illumination light source, the critical dimension (CD) and the resolution of the width can reach a desirable value. However, since the dipole illumination light source only provides a better resolution for width direction, the simulated CD of the length (201.4 nm) still cannot meet the predetermined value (160 nm).

In order to make the simulated CD of the length reach the predetermined value (160 nm), a photomask pattern with a reduced length is required. FIG. 3 shows a photomask pattern with a reduced length and FIG. 4 shows the simulation result of relative intensity of light in an exposure process using the photomask of FIG. 3. As shown in FIG. 3, when decreasing the length of the stripe pattern 102, for example, from 160 nm to 100 nm, the simulation result in FIG. 4 reveals that the simulated CD of length (182.8 nm) still cannot meet the predetermined value (160 nm) and both the resolutions of the length and the width become worse.

One approach to the above-mentioned problem is changing the illumination light source from a dipole shape to a cross-quadrapole shape. FIG. 5 shows the simulation result of relative intensity of light in an exposure process using the photomask of FIG. 1. When using the cross-quadrapole illumination light source having both x and y resolutions, as shown in FIG. 5, although the simulated CD of the length can reach the predetermined value (160 nm), however, the resolution of the width is reduced, leading to a poor quality of the image.

Accordingly, a novel exposure method is still needed to form tight-pitched patterns with a desired CD and an improved resolution.

SUMMARY OF THE INVENTION

The present invention therefore provides an exposure method for forming tight-pitched patterns with improved resolution.

According to one embodiment of the present invention, a method of forming tight-pitched patterns is provided. First, a target pattern is provided. The target pattern comprises a plurality of first stripe patterns. Each of the first stripe patterns has a first width and a first length. Then, a photomask comprising a plurality of second stripe patterns corresponding to the first stripe patterns is provided. Each of the second stripe patterns has a second width and a second length. Then, a first exposure process with the photomask is provided in an exposure system. The first exposure process uses a first light source with a higher resolution that is capable of resolving the second width of each of the second stripe patterns. Finally, a second exposure process with the photo-mask is provided in the exposure system. The second exposure process uses a second light source with a lower resolution that is not adequate to resolve the second width of each of the second stripe patterns.

In the present invention, only one mask is used, so there is no overlapping problem in the two exposures process, and there is no noise resulting from the mask registration difference between masks.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
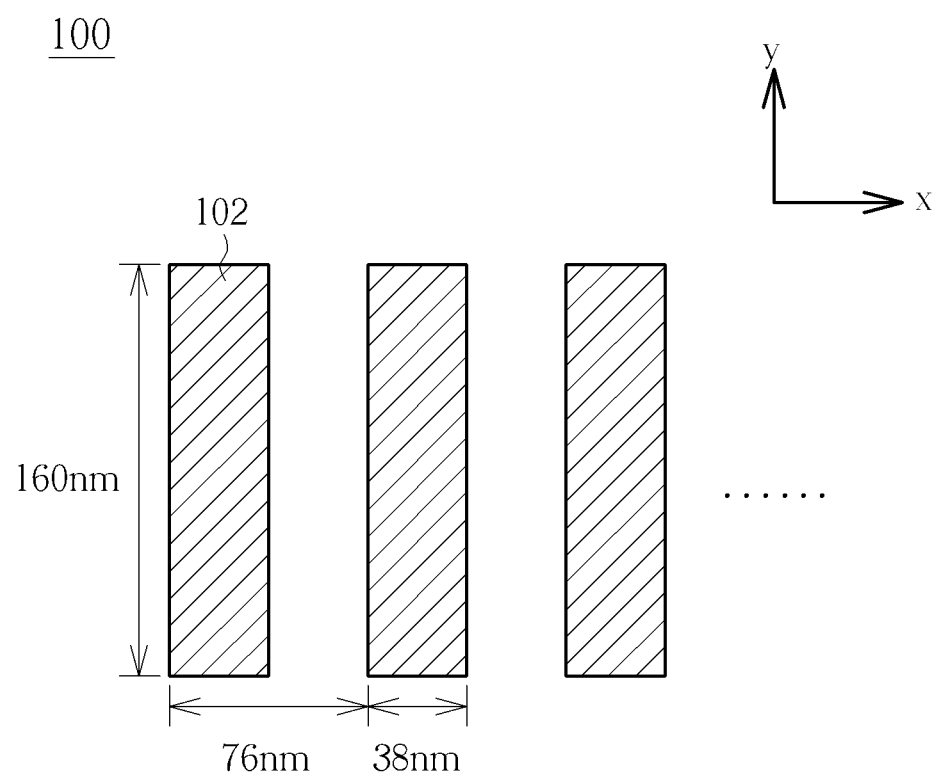
FIG. 1 shows a schematic diagram of a photo-mask pattern in conventional arts.
Figure 2:
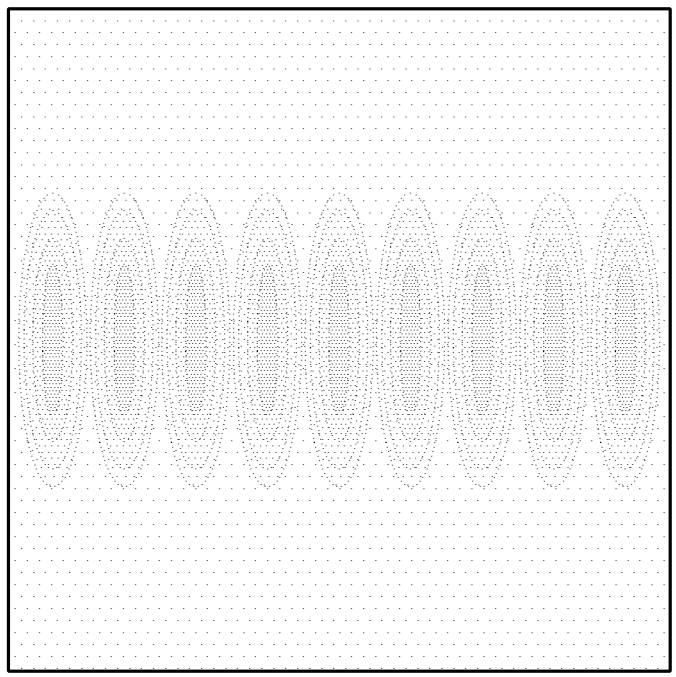
FIG. 2 shows a schematic diagram of the simulation result of the relative intensity of light in an exposure process using the photo-mask of FIG. 1.
Figure 3:
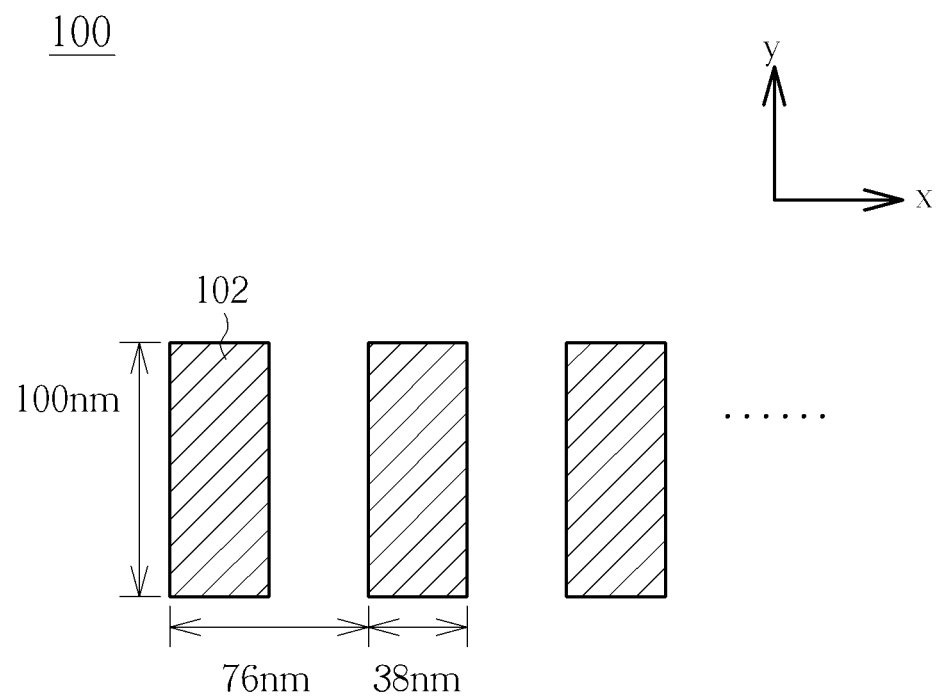
FIG. 3 shows a schematic diagram of photo-mask pattern with a reduced length.
Figure 4:
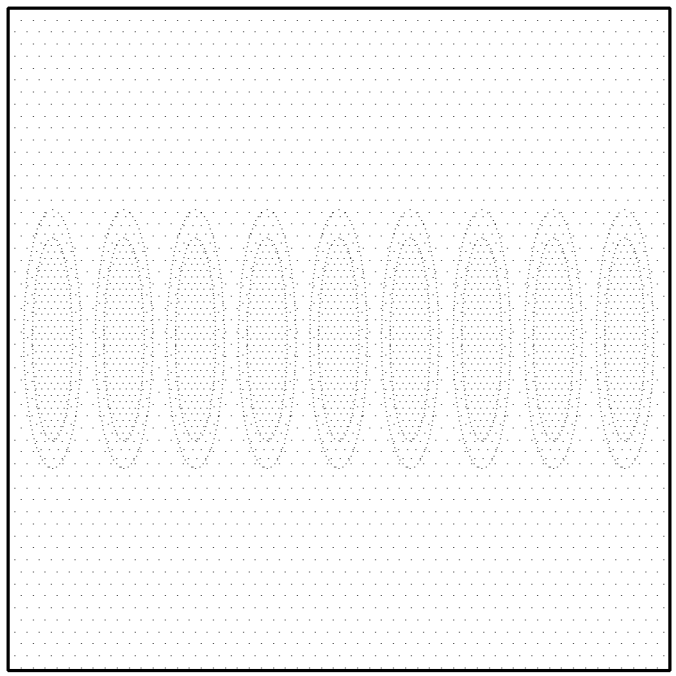
FIG. 4 shows a schematic diagram of the simulation result of the relative intensity of light in an exposure process using the photo-mask of FIG. 3.
Figure 5:
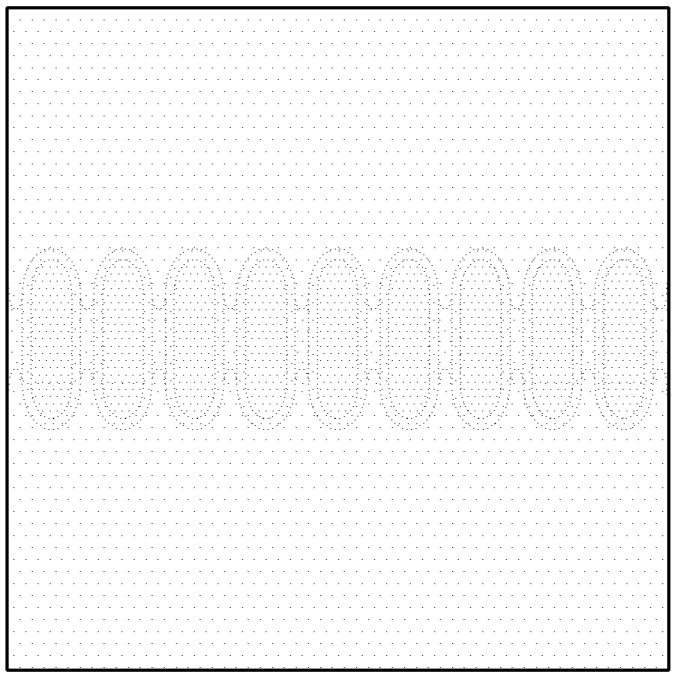
FIG. 5 shows a schematic diagram of the simulation result of the relative intensity of light in an exposure process using the photo-mask of FIG. 1, when using the cross-quadrapole illumination light source having both x and y polarizations.
Figure 6:
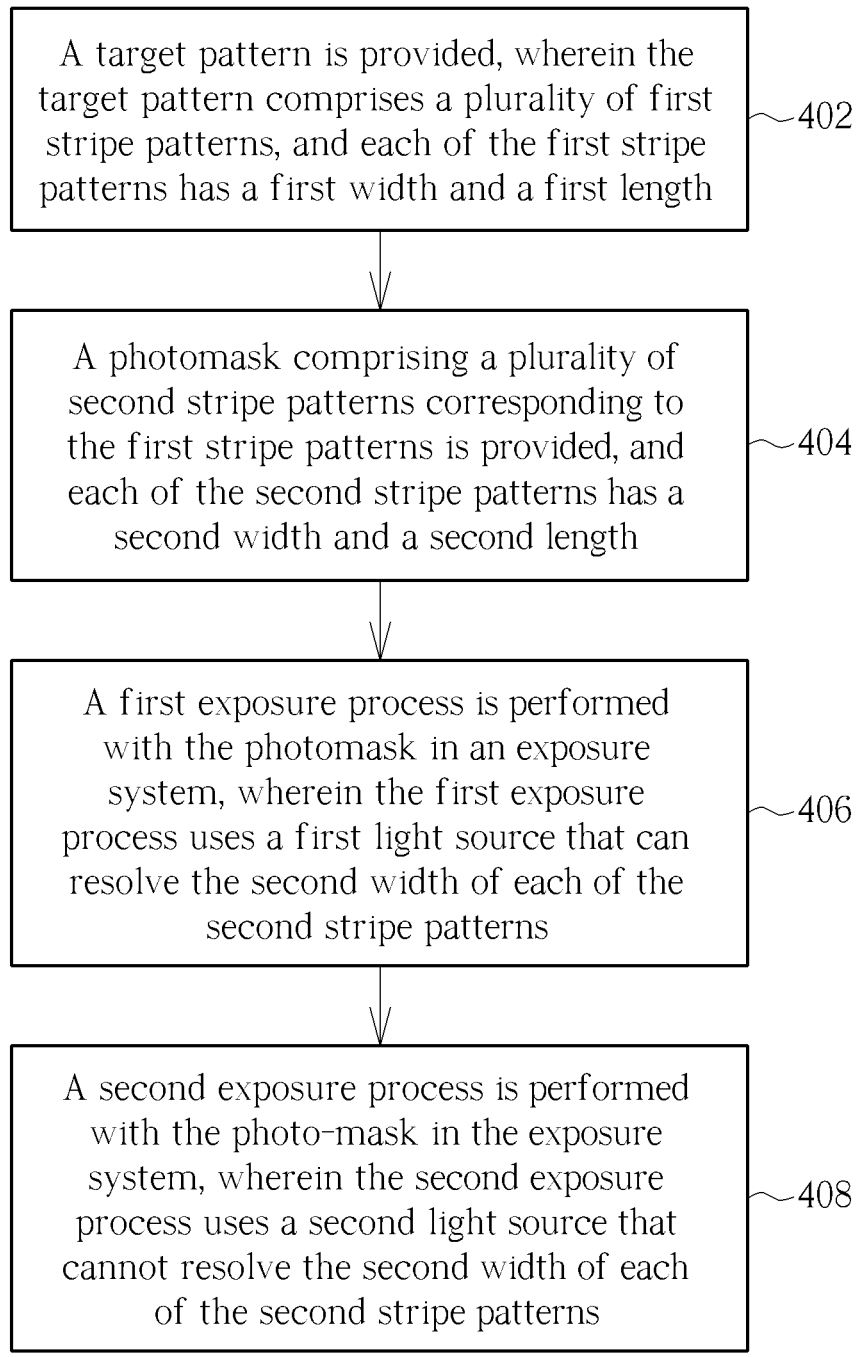
FIG. 6 shows a schematic diagram of the flow chart of the exposure method according to one embodiment of the present invention.
Figure 7:
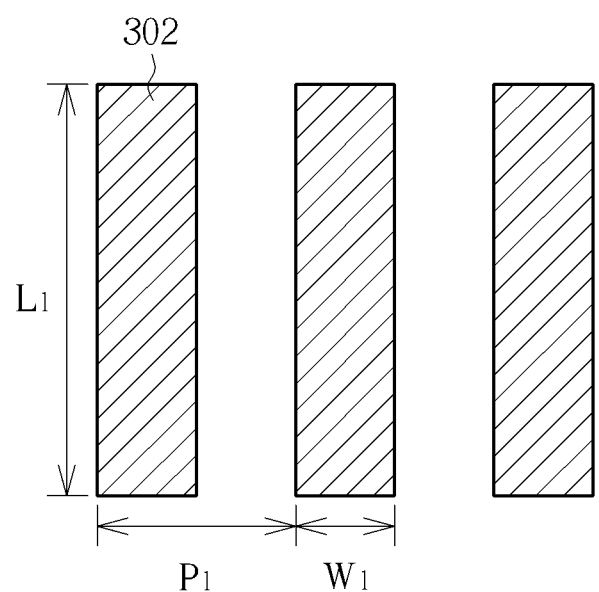
FIG. 7 shows a schematic diagram of the target pattern according to one embodiment of the present invention.
Figure 7:
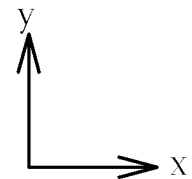

FIG. 6 is a flow chart of the exposure method according to one embodiment of the present invention. As shown in FIG. 6, the exposure method of the present invention includes the following steps. First, a target pattern is provided (step 402). The target pattern refers to the desired and final pattern which will be formed on the semiconductor photoresist layer (not shown) in the following steps and reflects the layout of the electrical circuit. FIG. 7 shows an exemplary target pattern according to one embodiment of the present invention. As shown in FIG. 7, the target pattern 300 includes a plurality of first stripe patterns 302, which are arranged in a repeating manner for example. It is understood that, besides the first stripe patterns 302, the target pattern 300 may include other features which are not shown in FIG. 7. In one preferred embodiment, the first stripe patterns 302 extend along the y-direction and are substantially parallel with each other. Each of the first stripe patterns 302 has a length $L_1$ (defined by the projection distance from the y axis) and a width $W_1$ (defined by the projection distance from the x axis). In one embodiment, the width $W_1$ is preferably the critical dimension (CD) of the exposure system and the length $L_1$ is greater than the width $W_1$. For example, the width $W_1$ is 38 nm, the length $L_1$ is 160 nm. The pitch $P_1$ which is twice of the width $W_1$ is 76 nm.

Figure 8:
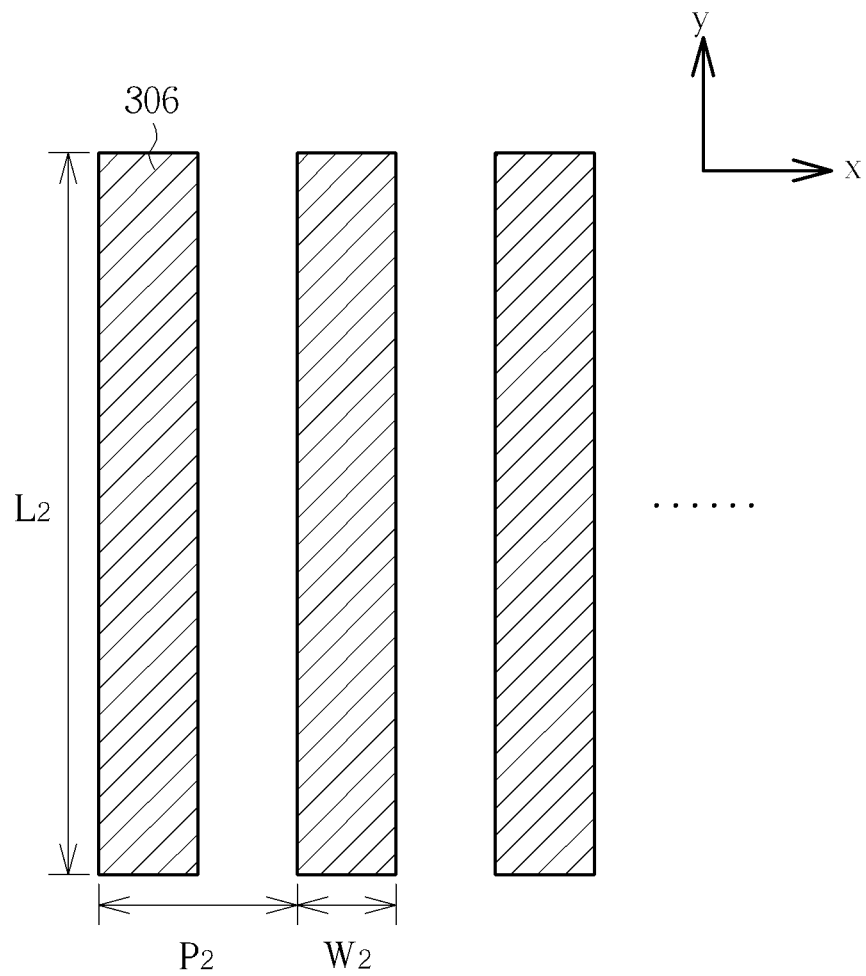
FIG. 8 shows a schematic diagram of the mask pattern according to one embodiment of the present invention.

In a second step, the target pattern 300 is input onto a photomask (not shown) to form a mask pattern (step 404). FIG. 8 shows a schematic diagram of the mask pattern according to one embodiment of the present invention. The mask pattern 304 includes a plurality of second stripe patterns 306, which are arranged correspondingly to the first stripe patterns 302. Each second stripe pattern 306 has a width $W_2$ and a length $L_2$. In one preferred embodiment, the width $W_2$ of the mask stripe pattern 306 is substantially equal to the width $W_1$ of the target stripe pattern 302, while the length $L_2$ of the mask stripe pattern 306 is greater than the length $L_1$ of the target stripe pattern 302, for example, the length $L_2$ is 1.2 times to 2 times larger than the length $L_1$. In one embodiment, the width $W_2$ is 38 nm and the length $L_2$ is 260 nm.

Figure 9:
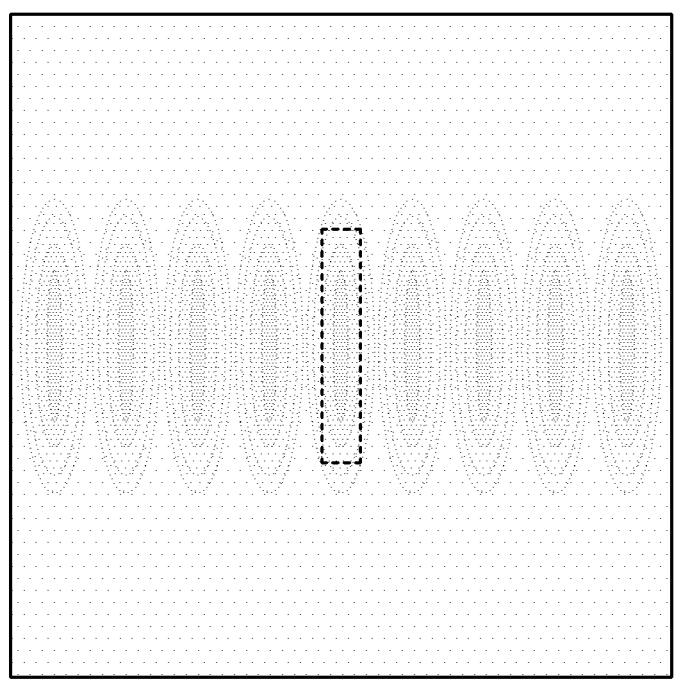
FIG. 9 shows a schematic diagram of the simulation result of the relative intensity of light in the first exposure process using the photo-mask of FIG. 8.

In a third step, a first exposure process is performed by using the photomask with the mask pattern 304, wherein the first exposure process uses a first light source which can resolve the width $W_2$ of the second stripe pattern (step 406). FIG. 9 shows a schematic diagram of the simulation result of the relative intensity of light in the first exposure process using the photo-mask of FIG. 8, wherein the dashed line depicts one of the second stripe patterns 306. As shown in FIG. 9, the first light source can provide a good resolution for the width $W_2$ (that is, $W_1$, since $W_1$ is substantially equal to $W_2$). For example, the resolution of the pattern can be determined according to formula 1 shown below:

$$R=(0.5 \cdot \lambda)/(N.A. \cdot (1+H\sigma)) \quad \text{(formula 1)}$$

wherein R is the resolution, $\lambda$ is the wavelength of the light source, N.A. is the numeral aperture, and $H\sigma$ is the aperture adjustable radius (sigma) of the exposure system. In one embodiment of the present invention, in order to provide the desired resolution for the width $W_2$, the first light source is preferably a dipole illumination light with a y direction polarization. In the preferred embodiment, the dipole illumination light does not pertain x direction polarization. The photomask is a phase shift mask (PSM), for example. In one embodiment, the wavelength of the first light source is 193 nm, the N.A. is about 1.35, and the $H\sigma$ is about 1, so that the resolution of $W_2$ (38 nm) is reachable due to R value (35.7 nm) from formula 1 calculation is smaller than $W_2$.

Figure 10:
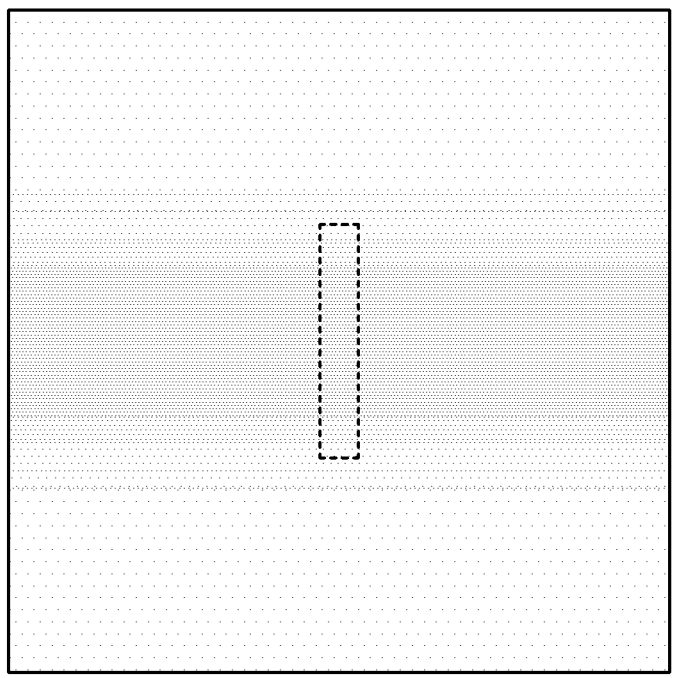
FIG. 10 shows a schematic diagram of the simulation result of the relative intensity of light in the second exposure process using the photo-mask of FIG. 8.

Subsequently, a second exposure process is performed using the same photomask, wherein the second exposure process uses a second light source which has very poor resolution for the width $W_2$ but can provide appropriate resolution for the length $L_2$ (step 408). FIG. 10 shows a schematic diagram of the simulation result of the relative intensity of light in the second exposure process using the photomask of FIG. 8, wherein the dashed line depicts one of the mask stripe patterns 306.

For example, when the width $W_2$ of the mask stripe pattern 306 is 38 nm and the length $L_2$ is 260 nm, the resolution should meet the conditions of the following equation:

$$38 \text{ nm} < (0.5 \cdot \lambda)/(N.A. \cdot (1+H\sigma)) < 260 \text{ nm}$$

In one embodiment, the wavelength is substantially the same in the first exposure process and the second exposure process, so the value of $(N.A. \cdot (1+H\sigma))$ in the second exposure process is smaller than that in the first exposure process. For example, in the second exposure process, if $\lambda$ is 193 nm, the value of $(N.A. \cdot (1+H\sigma))$ in the second exposure process is between 0.371 and 2.539. In the present invention, the value of $(N.A. \cdot (1+H\sigma))$ can be altered by changing either the N.A. or the $H\sigma$, for example, by decreasing the value of N.A., decreasing the value of $H\sigma$ or decreasing both of them. For example, the N.A. can be set at 0.9 and the $H\sigma$ can be set at 0.35, so that the value of $(N.A. \cdot (1+H\sigma))$ is 1.215.

Figure 11:
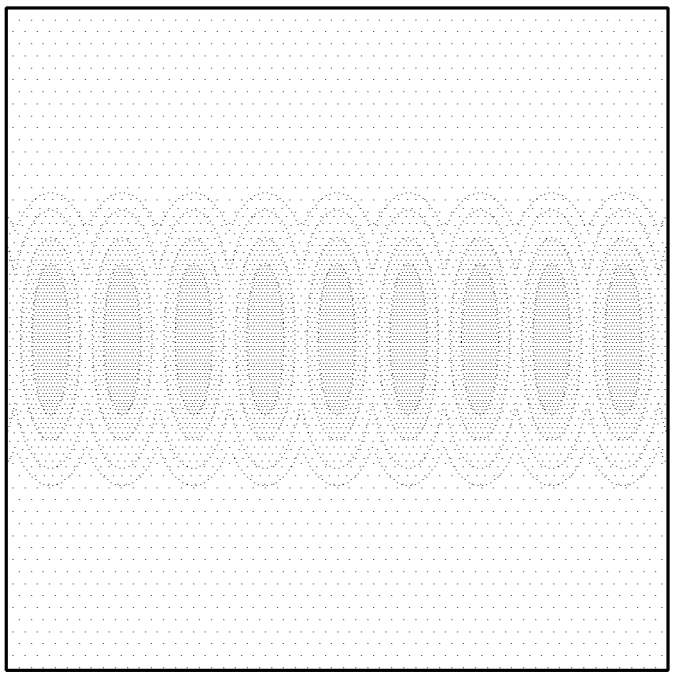
FIG. 11 shows a schematic diagram of the simulation result of the relative intensity of light combining the first exposure process and the second exposure process.

FIG. 11 shows a schematic diagram of the simulation result of the relative intensity of light combining the first exposure process and the second exposure process. As shown in FIG. 11, with the dosage ratio between the first exposure and second exposure being 1:1.65, both simulated resolution results of the width (37.9 nm) and the length (159.8 nm) are close to the desired value (38 nm for the width and 160 nm for the length), and the contrast can be still kept at a high value (0.622 and 0.787). As a result, a pattern with a high resolution and the desired CD can be obtained by using the method in the present invention.

It is understood that the present invention can be used for a lithographic method. For example, a photoresist layer (not shown) can be formed on a substrate (not shown). By using the photomask with the mask pattern 304 and by subsequently performing the first exposure process and the second process, the target pattern 300 can be formed on the photoresist layer. The desired layout of the electrical circuit is consequently formed on the substrate.

To sum up, the present invention provides a method of forming a pattern by using only one single mask in the first exposure process and the second exposure process. It is featured that, in the first exposure process, the first light source that can provide a good resolution for the width of the pattern is utilized, while in the second exposure, a second light source that has very poor resolution for the width is utilized. On one hand, the resolution of the width can be kept at a high value since the width of pattern has been determined during the first exposure process and is not seriously affected during the second exposure process. On the other hand, the resolution of the length of the pattern is mainly determined by the second exposure process.

It is noted that the CDs of the length and the width are obtained by adjusting the dosage ratio of the first exposure process and the second exposure process. Since the resolution of the length is mainly determined by the second exposure process, the light intensity or the exposure time of the second exposure process is greater than that of the first exposure process, so as to obtain a desired CD for the length during the second exposure process. Moreover, as the length $L_2$ of the second stripe pattern 306 is greater than the length $L_1$ of the first stripe pattern 302, it provides more margins to form the desired CD of the length $L_1$ by adjusting the dosage ratio between the first exposure process and the second exposure process.

By using the method provided in the present invention, a good image quality can be obtained. In addition, only one mask is used, so there is no overlapping problem during the two exposures processes, and there is no noise resulted from the mask registration difference between masks. Besides, the present invention can be easily incorporated into current lithography processes and apparatuses without further adding machines or units. Consequently, the manufacturing process time and costs can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming tight-pitched patterns, comprising:
   providing a target pattern, wherein the target pattern comprises a plurality of first stripe patterns, and each of the first stripe patterns has a first width and a first length;
   providing a photomask comprising a plurality of second stripe patterns corresponding to the first stripe patterns, and each of the second stripe patterns has a second width and a second length;
   performing a first exposure process with the photomask in an exposure system, wherein the first exposure process uses a first light source with a higher resolution that is capable of resolving the second width of each of the second stripe patterns, wherein the first light source is a dipole illumination light; and
   after performing the first exposure process, performing a second exposure process with the same photomask in the exposure system, wherein the second exposure process uses a second light source with a lower resolution that is not adequate to resolve the second width of each of the second stripe patterns.

2. The method of forming tight-pitched patterns according to claim 1, wherein the second light source is capable of resolving the second length of the second stripe patterns.

3. The method of forming tight-pitched patterns according to claim 1, wherein the second length of each of the second stripe patterns is greater than the first length of each of the first stripe patterns.

4. The method of forming tight-pitched patterns according to claim 1, wherein the second width of each of the second stripe patterns is substantially equal to the first width of each of the first stripe patterns.

5. The method of forming tight-pitched patterns according to claim 4, wherein the first width and the second width are equal to the critical dimensions of the exposure system.

6. The method of forming tight-pitched patterns according to claim 1, wherein the resolution of the pattern is determined by the following equation, $$R=(0.5 \cdot \lambda)/(N.A. \cdot (1+H\sigma)),$$

wherein R is the resolution, $\lambda$ is a wavelength of light source, N.A. is a numeral aperture, and $H\sigma$ is an aperture adjustable radius of the exposure system.

7. The method of forming tight-pitched patterns according to claim 6, wherein the wavelength of the first light source is the same as that of the second light source.

8. The method of forming tight-pitched patterns according to claim 6, wherein the value of $(N.A. \cdot (1+H\sigma))$ in the second exposure process is smaller than that in the first exposure process.

9. The method of forming tight-pitched patterns according to claim 6, wherein the first width and the second width are 38 nm, the first length is 160 nm, and the second length is 260 nm.

10. The method of forming tight-pitched patterns according to claim 9, wherein in the exposure system, the wavelength ($\lambda$) is 193 nm.

11. The method of forming tight-pitched patterns according to claim 9, wherein in the first exposure process, the N.A. of the first light source is 1.35 and the $H\sigma$ is 1.

12. The method of forming tight-pitched patterns according to claim 9, wherein in the second exposure process, the value of $(N.A. \cdot (1+H\sigma))$ is between 0.371 and 2.539.

13. The method of forming tight-pitched patterns according to claim 1 further comprising:
   providing a substrate;
   forming a photoresist layer on the substrate; and
   after performing the first exposure process and the second exposure process, forming the target pattern on the photoresist layer.

14. The method of forming tight-pitched patterns according to claim 1, wherein the dipole illumination light has polarization on a lengthwise direction of the second stripe patterns.

* * * * *